United States Patent [19]
Narita

[11] Patent Number: 5,953,191
[45] Date of Patent: Sep. 14, 1999

[54] PROTECTION CIRCUIT AGAINST ELECTROSTATIC CHARGE APPLIED BETWEEN POWER SUPPLY TERMINALS FOR PREVENTING INTERNAL CIRCUIT THEREFROM REGARDLESS OF POLARITY THEREOF

[75] Inventor: Kaoru Narita, Toyko, Japan

[73] Assignee: NEC Corporation, Tokyo, Japan

[21] Appl. No.: 09/016,636

[22] Filed: Jan. 30, 1998

[30] Foreign Application Priority Data

Jan. 31, 1997 [JP] Japan .................................. 9-018246

[51] Int. Cl.⁶ ............................. H01L 27/04; H02H 9/00
[52] U.S. Cl. ................................. 361/56; 361/91
[58] Field of Search .............................. 361/56, 111, 91; 257/355–363

[56] References Cited

U.S. PATENT DOCUMENTS 5,751,051 5/1998 Hayano .................................. 257/546

FOREIGN PATENT DOCUMENTS 7-86510 3/1995 Japan ............................. H01L 27/04

OTHER PUBLICATIONS

Kaoru Narita et al. "A Novel On–Chip Electrostatic Discharge (EDS) Protection for Beyond 500 MHz DRAM", IEEE, 1995, pp. 21.1.1–21.1.4, No Month.

*Primary Examiner*—Ronald W. Leja
*Attorney, Agent, or Firm*—Young & Thompson

[57] ABSTRACT

Voltage clamping elements are respectively paired with first diodes, and the pairs of voltage clamping elements/first diodes are connected between a first common discharge line and power terminals selectively supplied with positive power voltage and ground voltage; however, the pairs of voltage clamping elements/first diodes can not prevent an internal circuit from excess voltage if a positive electrostatic pulse with respect to the positive power voltage is applied to the ground terminal; second diodes are connected between a second common discharge line and the terminals in such a manner as to discharge the positive electrostatic pulse through the associated forward-biased second diodes, and the internal circuit is perfectly prevented from the excess voltage.

13 Claims, 11 Drawing Sheets

PROTECTION CIRCUIT AGAINST ELECTROSTATIC CHARGE APPLIED BETWEEN POWER SUPPLY TERMINALS FOR PREVENTING INTERNAL CIRCUIT THEREFROM REGARDLESS OF POLARITY THEREOF

FIELD OF THE INVENTION

This invention relates to a semiconductor device and, more particularly, to a protection circuit against electrostatic discharge incorporated in the semiconductor device.

DESCRIPTION OF THE RELATED ART

A typical example of the protection technology against the electrostatic discharge is disclosed in Japanese Patent Publication of Unexamined Application No. 7-86510, and FIG. 1 illustrates the prior art protection circuit forming a part of an integrated circuit. The integrated circuit largely comprises an internal circuit 1, various terminals 2, 3, 4, 5, 6, 7, 8 and 9, a common discharge line 10 and a plurality of protection elements 11, 12, 13, 14, 15, 16, 17 and 18 against electrostatic charge. The internal circuit 1 is implemented by CMOS (Complementary Metal-Oxide-Semiconductor) transistors, and occupies most of the real estate of the semiconductor chip. The terminals 2 to 9, the common discharge line 10 and the protection elements 11 to 19 occupy remaining area of the real estate. The protection elements 11 to 19 are associated with the terminals 2 to 9, respectively. A voltage clamping element 11a, 12a, 13a, 14a, 15a, 16a, 17a or 18a and a diode 11b, 12b, 13b, 14b, 15b, 16b, 17b or 18b constitute each of the electrostatic protection elements 11 to 19, and the voltage clamping elements 11a to 18a and the diodes 11b to 18b are connected in parallel between the associated terminals 2 to 9 and the common discharge line 10. The terminals 2 to 8 are respectively assigned to power voltage Vdd, an input signal Sin, power voltage Vss, the power voltage Vdd, an output signal Sout, the power voltage Vss, power voltage Vss, and the terminal 9 is called as "terminal n". For this reason, the terminals 2 to 9 are hereinbelow referred to as "Vdd terminal 2", "input signal terminal 3", "Vss terminal 4", "VddQ terminal 5", "output signal terminal 6", "VssQ terminal 7", "Vss terminal 8" and "n-terminal 9", respectively.

The internal circuit 1 includes a main circuit 19, an input inverter 20, an output inverter 21 and an input resistor 22. The main circuit is connected to the Vdd terminal 2 and the Vss terminals 4/8 through power supply lines 23/24/25, and is powered with those power voltages Vdd and Vss. The input signal terminal 3 is connected through the input resistor 22 and the input inverter 20 to the main circuit 19, and the main circuit is connected through the output inverter 21 to the output signal terminal Sout.

The input inverter is implemented by a series combination of a p-channel enhancement type field effect transistor 26 and an n-channel enhancement type field effect transistor 27, and the series combination 26/27 is connected between the power supply lines 23 and 24. The input signal terminal 3 is connected through the input resistor 22 to the gate electrode of the p-channel enhancement type field effect transistor 26 and the gate electrode of the n-channel enhancement type field effect transistor 27. The input signal Sin is supplied through the input resistor 22 to the gate electrodes of the field effect transistors 26/27, and causes the p-channel enhancement type field effect transistor 26 and the n-channel enhancement type field effect transistor 27 to complementary turn on and off. Then, the complementary input signal CSin is supplied to the main circuit 19.

The output inverter 21 is also implemented by a series combination of a p-channel enhancement type field effect transistor 28 and an n-channel enhancement type field effect transistor 29, and the series combination 28/29 is connected between the VddQ terminal 5 and the VssQ terminal 7. The output signal terminal 6 is connected through to the common drain node 30 between the p-channel enhancement type field effect transistor 28 and the n-channel enhancement type field effect transistor 29. The complementary output signal CSout is supplied to the gate electrode of the p-channel enhancement type field effect transistor 28 and the gate electrode of the n-channel enhancement type field effect transistor 29, and the output signal Sout is supplied from the common drain node 30 to the output signal terminal Sout. Thus, the output inverter 21 is powered with the power voltages Vdd/Vss supplied from the power voltage terminals 5/7, and the switching action of the output inverter 21 does not affect the potential level on the power supply lines 23/24.

When electrostatic charge is applied between any two of the terminals 2 to 9, the two terminals 2–9, the associated protection elements 11–18 and the common discharge line 10 form a discharging path, and the electrostatic charge is hardly applied to the internal circuit 1. Thus, the protection elements 11 to 18 prevent the internal circuit 1 from the electrostatic charge. An electrostatic pulse ESP is, by way of example, applied to the signal input terminal 3 as shown in FIG. 2. If the electrostatic pulse ESP is positive with respect to the Vss terminal 4, the current is discharged from the signal input terminal 3 through the voltage clamping element 12a, the common discharge line 10 and the diode 13b to the Vss terminal 4 as indicated by arrow Da, and the electrostatic discharge ESD takes place between the input signal terminal 3 and the Vss terminal 4. On the other hand, if the electrostatic pulse ESP is negative with respect to the Vss terminal 4, the current is discharged from the Vss terminal 4 through the voltage clamping element 13a, the common discharging line 10 and the diode 12b to the signal input terminal 3 as indicated by arrow Db, and the electrostatic discharge ESD also takes place between the input signal terminal 3 and the Vss terminal 4. The impedance of the input terminal is much larger than the impedance of the discharge path Da/Db, and the electrostatic pulse ESP is not applied to the internal circuit 1. In other words, the protection elements 12/13 are effective against the electrostatic pulse ESP.

However, when the negative electrostatic pulse ESP with respect to the Vss terminal 4 is applied to the Vdd terminal 2, the electrostatic pulse ESP destroys the internal circuit 1. In detail, FIG. 3 shows the voltage-to-current characteristics of the voltage clamping elements 11a to 18a, and FIG. 4 shows the voltage-to-current characteristics of the internal circuit 1. When the voltage level is between the thresholds Vtm and Vtp, the voltage clamping elements 11a to 18a does not flow any current, and the amount of current 1 is zero. If the voltage exceeds the thresholds Vtm and Vtp, the current is increased, and the voltage is clamped at certain level Vsbp or Vsbm. Thus, the positive voltage-to-current characteristics are point symmetry with the negative voltage-to-current characteristics.

On the other hand, the voltage-to-current characteristics of the internal circuit 1 are not symmetrical as shown in FIG. 4. If the voltage applied to the Vdd terminal 2 is positive with respect to the Vss terminal 4, the impedance of the internal circuit 1 is so high that only a small amount of current flows into the internal circuit 1. When the voltage reaches the threshold Vtp, the voltage clamping elements 11a to 18a discharges the current to the cornmon discharge line 10, and serious potential is never applied to the internal circuit 1. However, if the voltage at the Vdd terminal 2 is negative with respect to the Vss terminal 4, the impedance of the internal circuit 1 is low, so that a large amount of current flows into the internal circuit. Even though the voltage clamping elements 11a to 18a set the limit on the potential level at the Vsbm, the large amount of electrostatic current flows through the internal circuit 1 as indicated by arrow Dc (see FIG. 2). In this situation, if there is a small circuit component on the current path Dc, the electrostatic current seriously damages the small circuit component, and electrostatic destruction takes place in the internal circuit 1.

The internal circuit 1 is prevented from the electrostatic destruction due to the negative electrostatic pulse applied between the Vdd terminal 2 and the Vss terminal 4 as follows. FIG. 5 illustrates another prior art protection circuit incorporated in a semiconductor integrated circuit device. Diode-connected field effect transistors 35, 36, 37, 38, 39 and 40 are incorporated in the prior art protection circuit. The other circuit components are similar to those of the prior art protection circuit shown in FIG. 1, and are labeled with the same references designating corresponding circuit components shown in FIG. 1. The diode-connected field effect transistors 35/36/37 are connected between the power supply lines 23 and 24, between the power supply lines 24 and 41 and between the power supply lines 41 and 42, and the diode-connected field effect transistors 38/39 are connected between the power supply lines 23 and 41 and between the power supply lines 24 and 42. The diode-connected field effect transistor 40 is connected between the power supply lines 23 and 42. Thus, the diode-connected field effect transistors 35 to 40 are associated with all the combinations between two power supply lines 23/24/41/42 assigned to different power voltage levels Vdd/Vss. The diode-connected field effect transistors 35 to 40 provide current paths bypassing the internal circuit 1, and the electrostatic pulse ESP does not destroy the circuit component of the internal circuit 1.

The prior art protection circuit shown in FIG. 5 effectively prevents the internal circuit 1 from the electrostatic pulse ESP. However, a large number of terminals are assigned to the power voltages Vdd/Vss in an ultra large scale integration. More than seven terminals are, by way of example, assigned to a video memory, and the diode-connected field effect transistors to be required are more than one hundred. If the manufacturer designs the ultra large scale integration to provide the diode-connected field effect transistors for all the combinations of two terminals assigned to the different power voltage levels Vdd/Vss, a large number of diode-connected field effect transistors are required for the prior art protection circuit, and are occupied on a non-ignoreable amount of real estate. For this reason, the prior art protection circuit is hardly employed in the ultra large scale integration.

Moreover, the diode-connected field effect transistors 35 to 40 do not provide stable protecting characteristics to the internal circuit 1. In detail, the diode-connected field effect transistors are assigned to a predetermined area on a semiconductor substrate, and the terminals assigned to the power voltage levels Vdd/Vss are differently spaced from the associated diode-connected field effect transistors. This means that the resistance is different between the terminals assigned to the power voltage levels Vdd/Vss depending upon the length along the current path. Even if the difference is of the order of several ohms, a large amount of current, which is several amperes, flows through the diode-connected field effect transistor, and seriously affects the internal circuit 1.

On the other hand, if the manufacturer tries to arrange the diode-connected field effect transistors 35 to 40 equally spaced from the associated terminals, the diode-connected field effect transistors are hardly arranged in the peripheral area already assigned thereto, and are mixed with the circuit components of the internal circuit 1 in the central area. Thus, there is a trade-off between the stable protecting characteristics and the layout design.

SUMMARY OF THE INVENTION

It is therefore an important object of the present invention to provide a protection circuit which is easily arranged in a small amount of real estate without sacrifice of stable protection characteristics.

To accomplish the object, the present invention proposes to provide another current path for the undesirable excess voltage.

In accordance with one aspect of the present invention, there is provided a protection circuit for preventing an internal circuit connected to first terminals assigned to electric signals and second terminals selectively assigned to a first power voltage and a second power voltage from excess voltage comprising a plurality of first protection elements connected between a first common discharge line and the first and second terminals and providing a bi-directional current path between two of the first and second terminals for current due to the excess voltage, and a plurality of second protection elements connected between a second common discharge line and the second terminals and providing a unidirectional current path between two of the second terminals for the current.

BRIEF DESCRIPTION OF THE DRAWINGS

The features and advantages of the protection circuit will be more clearly understood from the following description taken in conjunction with the accompanying drawings in which.

DESCRIPTION OF THE PREFERRED EMBODIMENTS

First Embodiment

Figure 6:
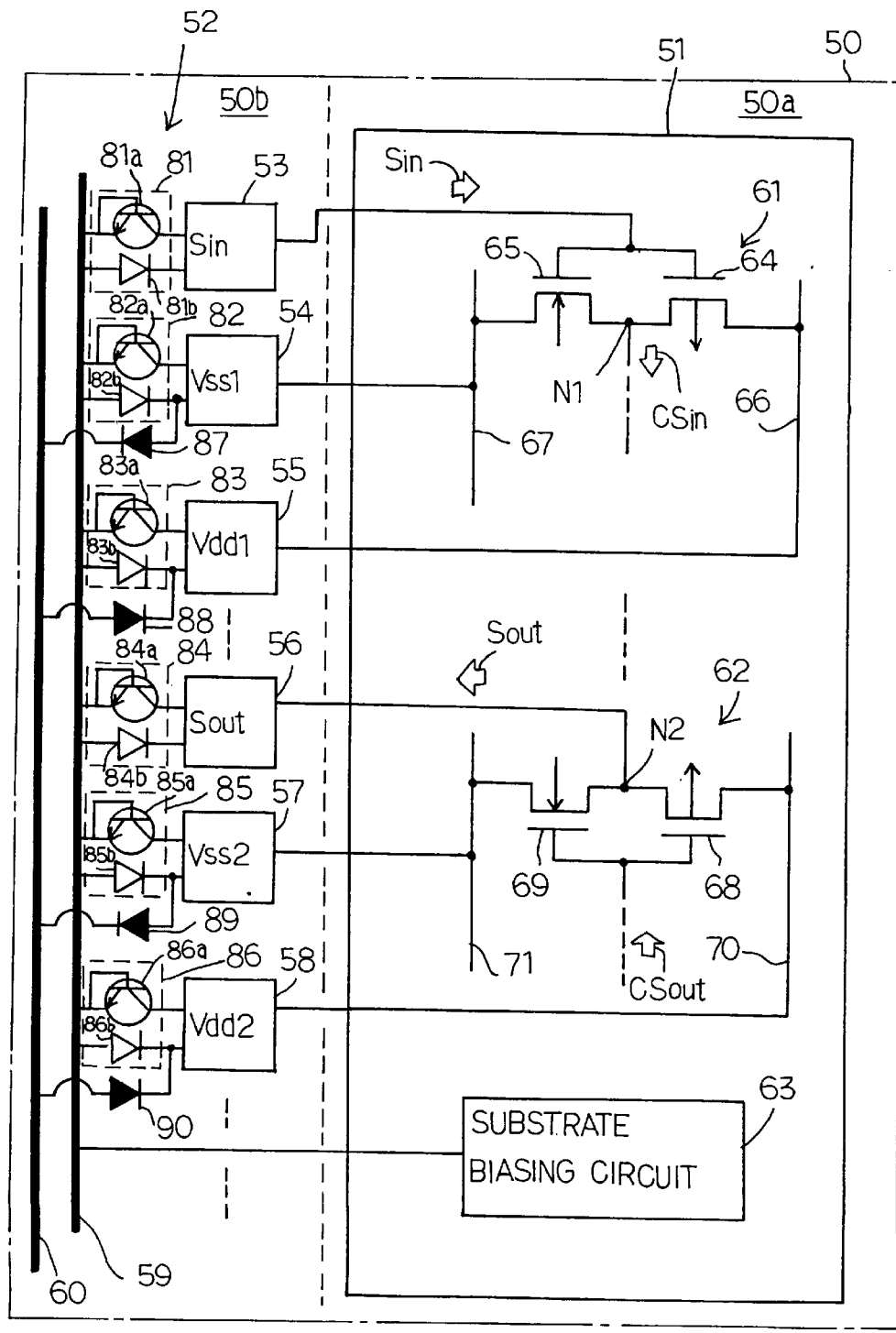
FIG. 6 is a circuit diagram showing the configuration of a protection circuit according to the present invention.

Referring to FIG. 6 of the drawings, a semiconductor integrated circuit device embodying the present invention is fabricated on a semiconductor substrate 50. The semiconductor substrate 50 has a major surface where an integrated circuit is fabricated. The major surface has a first area 50a assigned to an internal circuit 51 and a second area 50b assigned to a protection circuit 52, a plurality of terminals 53, 54, 55, 56, 57 and 58, a first common discharge line 59 and a second common discharge line 60. Though not shown in FIG. 6, the semiconductor substrate 50 is sealed in a package.

The internal circuit 51 includes an input inverter 61, an output inverter 62 and a substrate biasing circuit 63. The input inverter 61 is implemented by a parallel combination of a p-channel enhancement type field effect transistor 64 and an n-channel enhancement type field effect transistor 65, and the parallel combination 64/65 is connected between power supply lines 66 and 67. An input signal Sin is supplied to the gate electrode of the p-channel enhancement type field effect transistor 64 and the gate electrode of the n-channel enhancement type field effect transistor 65, and causes the p-channel enhancement type field effect transistor 64 and the n-channel enhancement type field effect transistor 65 to complementarily turn on and off so as to supply the complementary input signal CSin from the common drain node N1 to another circuit component of the internal circuit 51.

The output inverter 62 is implemented by a parallel combination of a p-channel enhancement type field effect transistor 68 and an n-channel enhancement type field effect transistor 69, and the parallel combination 68/69 is connected between power supply lines 70 and 71. The complementary output signal CSout is supplied to the gate electrode of the p-channel enhancement type field effect transistor 68 and the gate electrode of the n-channel enhancement type field effect transistor 69, and causes the p-channel enhancement type field effect transistor 68 and the n-channel enhancement type field effect transistor 69 to complementarily turn on and off so as to supply an output signal Sout from the common drain node N2 to one of the terminals.

The substrate biasing circuit 63 is connected to the first common discharge line 59, and maintains the potential of the semiconductor substrate 50 at a predetermined level.

The terminals 53 to 58 are formed of conductive metal, and are assigned to the input signal Sin, power voltage Vss, power voltage Vdd different from the power voltage Vss, the output signal Sout, the power voltage Vss and the power voltage Vdd, respectively. In this instance, the power voltage Vss is the ground level, and Vdd is positive power voltage level. Although only six terminals 53 to 58 are shown in FIG. 6, the semiconductor integrated circuit device has other terminals assigned to other input/output signals and other sets of terminals assigned to the power voltages Vss/Vdd. The terminals 53 to 58 are labeled with "Sin", "Vss1", "Vdd1", "Sout", "Vss2" and "Vdd2", respectively, in the drawings.

Figure 3:
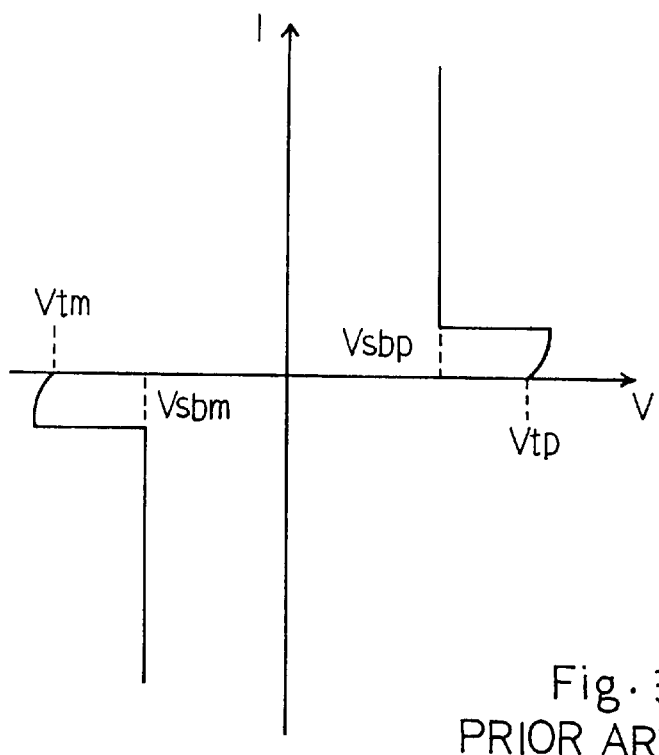
FIG. 3 is a graph showing the voltage-to-current characteristics of the clamping voltage elements.
Figure 4:
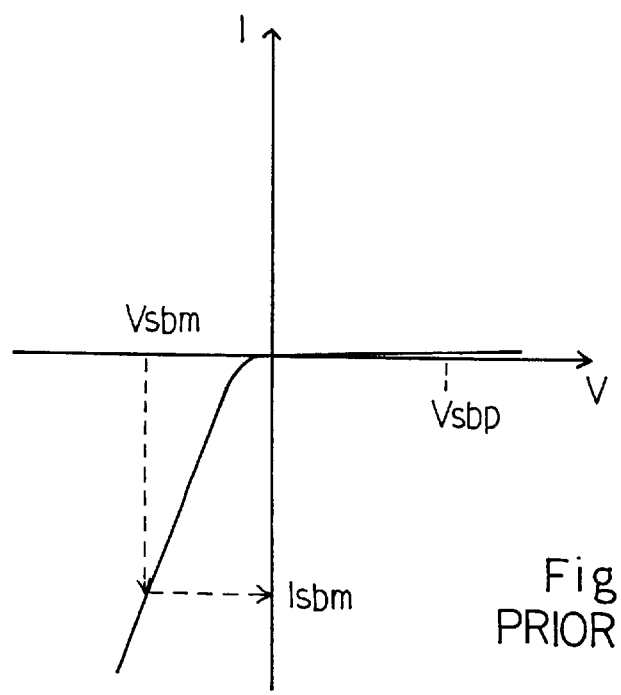
FIG. 4 is a graph showing the voltage-to-current characteristics of the internal circuit.
Figure 5:
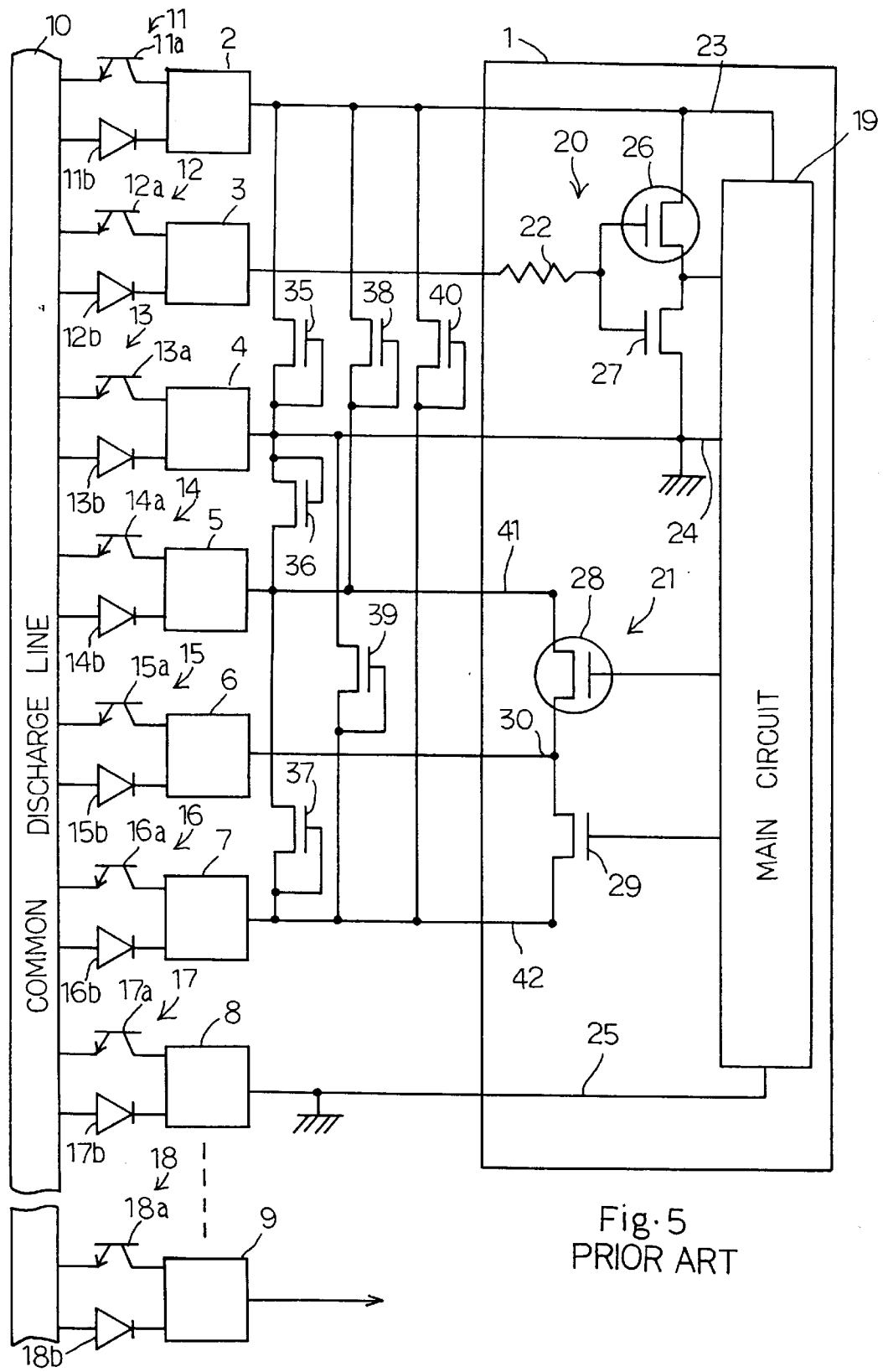
FIG. 5 is a circuit diagram showing another prior art protection circuit incorporated in the semiconductor integrated circuit device.

The protection circuit 52 includes a plurality of protection elements 81/82/83/84/85/86 respectively connected between the first common discharge line 59 and the terminals 53 to 58 and diodes 87, 88, 89 and 90 connected between the second common discharge line 60 and the terminals 54/55/57/58 assigned to the power voltages Vss/Vdd. Each of the protection elements 81–86 is implemented by a parallel combination of a bipolar transistor 81a/82a/ 83a/84a/85a/ 86a and a diode 81b/82b/83b/84b/85b/86b. The bipolar transistor 81–a86a serve as voltage clamping elements, and has a collector node connected to the associated terminal 53/54/55/56/57/58, an emitter connected to the first common discharge line 59 and the base node connected to the emitter node. The threshold Vtp (see FIG. 3) is of the order of 10 volts, and is much lower than the withstanding voltage of the internal circuit 51. The clamping level Vsbp is of the order of 6 volts. The diode 81b–86b has a cathode connected to the associated terminal 53–58 and an anode connected to the first common discharge line 59. The built-in potential of the diodes 81b–86b is of the order of 0.8 volt.

The diodes 87 and 89 have respective anodes connected to the associated terminals 54/57 and respective cathodes connected to the second common discharge line 60. On the other hand, the diodes 88/90 have respective anodes connected to the second common discharge line 60 and respective cathodes connected to the associated terminals 55/58. The built-in potential of the diodes 87–90 is of the order of 0.8 volt.

In this instance, the protection elements 81 to 86 and the diodes 87 to 90 serve as first protection elements and second protection elements, respectively.

Figure 7:
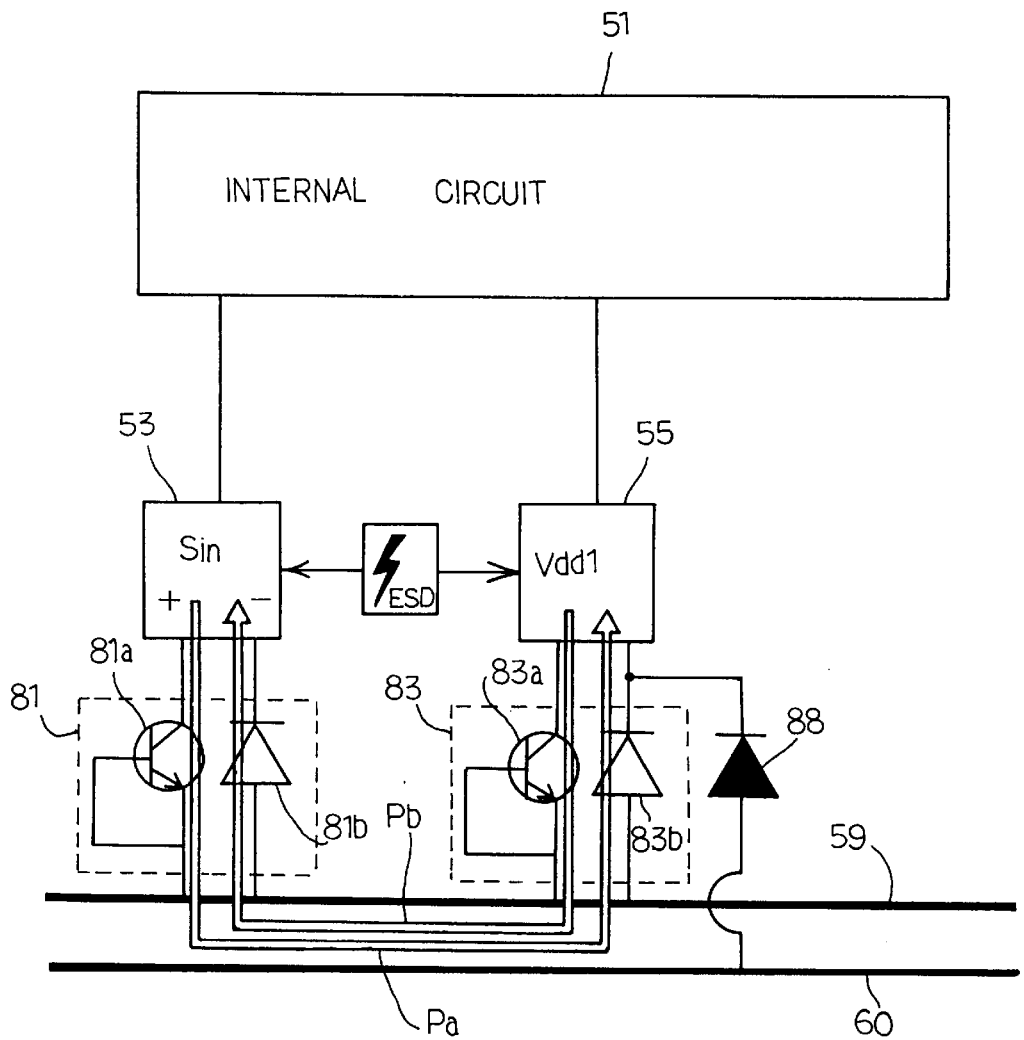
FIG. 7 is a circuit diagram showing discharge paths between a terminal assigned to an input signal and another terminal assigned to a power voltage.

The protection circuit 52 behaves as follows. Assuming now that the package is locally charged, excess voltage is applied to the terminal 53 assigned to the input signal Sin with respect to the terminal 55 assigned to the power voltage Vdd as shown in FIG. 7.

Firstly, the excess voltage is assumed to be a positive electrostatic pulse. Even if the positive electrostatic pulse is higher than the 10 volts, the current does not flows into the internal circuit 51, because the impedance of the internal circuit 51 is very large. When the potential level at the terminal 53 exceeds over 10 volts, the voltage clamping element 81a turns on, and the voltage clamping element 81a and the diode 83b maintain the potential difference between the terminals 53 and 55 equal to the total of the clamping voltage Vsbp and the built-in potential. In this instance, the potential difference between the terminals 53 and 55 is 6.8 volts, and only a negligible amount of current flows into the internal circuit 51. Thus, the electrostatic pulse flows from the terminal 53 through the voltage clamping element 81a, the first common discharge line 59 and the diode 83b to the terminal 55 as indicated by arrow Pa, and electrostatic discharge ESP takes place between the terminals 53 and 55. As a result, the internal circuit 51 is prevented from the electrostatic pulse, and is never damaged.

The excess voltage is assumed to be a negative electrostatic pulse. Even if the potential difference exceeds over 10 volts, the impedance of the internal circuit 51 is so large that only a negligible amount of current flows into the internal circuit 51. When the potential difference reaches 10 volts, the voltage clamping element 83b turns on, and the potential difference between the terminals 53 and 55 is also maintained at 6.8 volts, i.e., the total of the clamping voltage Vsbp of the voltage clamping element 83a and the built-in potential of the diode 81b. As a result, the current flows from the terminal 55 through the voltage clamping element 83a, the first common discharge line 59 and the diode 81b to the terminal 53 as indicated by arrow Pb, and the electrostatic discharge ESP takes place between the terminals 55 and 53 without any destruction of the internal circuit 51.

Figure 8:
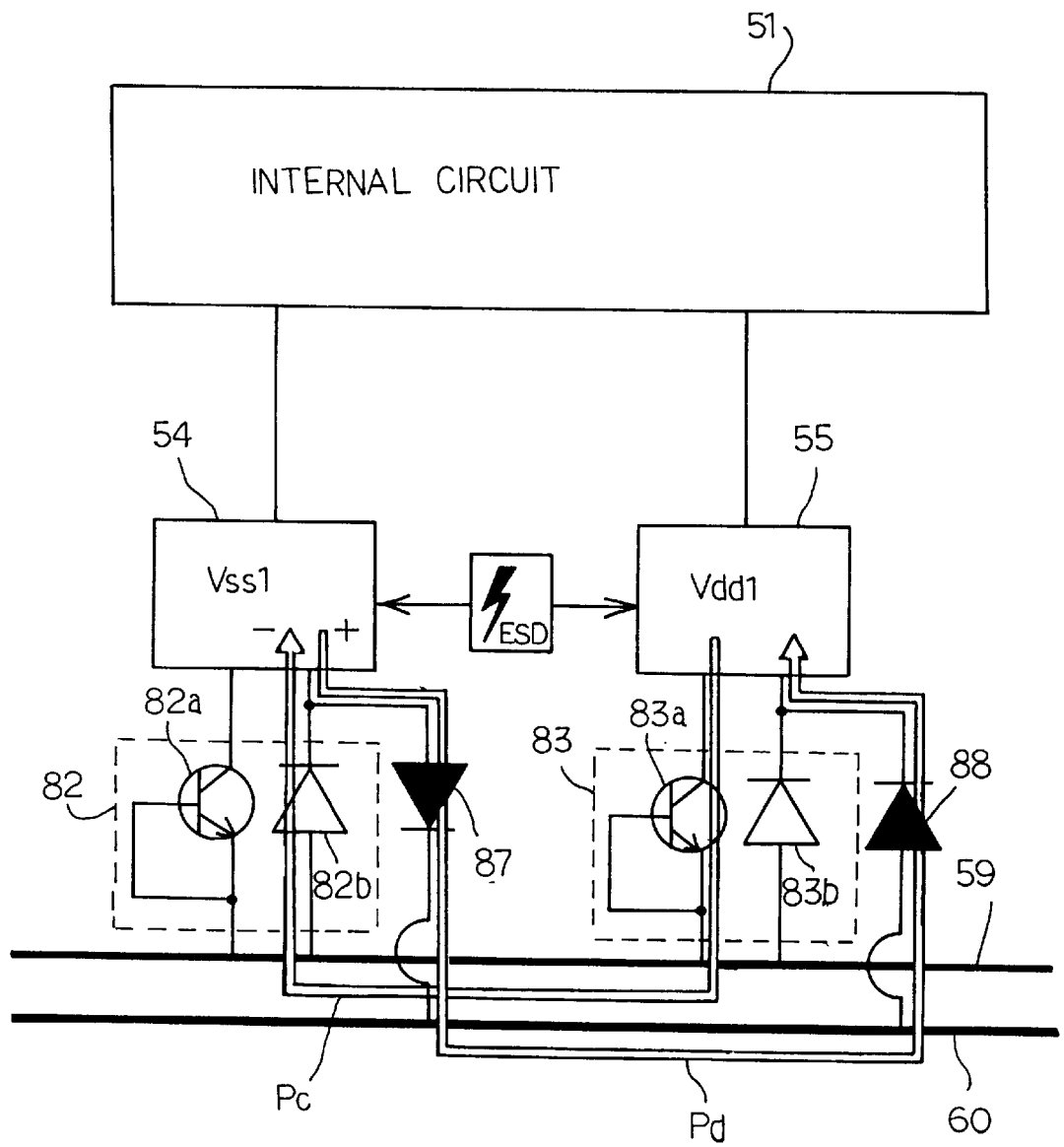
FIG. 8 is a circuit diagram showing discharge paths between a terminal assigned to a power voltage and another terminal assigned to different power voltage.

Subsequently, excess voltage is applied to the terminal 54 with respect to the terminal 55. FIG. 8 illustrates current paths between the terminals 54 and 55. If the excess voltage is assumed to be a negative electrostatic pulse, the impedance of the internal circuit 51 is so large that a negligible amount of current flows into the internal circuit 51. When the potential difference reaches 10 volts, the voltage clamping circuit 83a turns on, and the current flows from the terminal 55 through the voltage clamping circuit 83a, the first common discharge line 59 and the diode 82b to the terminal 54 as indicated by arrow Pc, and the potential difference is maintained at the total of the clamping voltage and the built-in potential, i.e., 6.8 volts. Thus, the protection circuit 52 prevents the internal circuit 51 from destruction due to the negative electrostatic pulse.

The excess voltage is a negative electrostatic pulse with respect to the terminal 55. Although the impedance of the internal circuit 51 is very low, a negligible amount of current flows into the internal circuit 51, because the terminal 54 is connected through the forward-biased diodes 87 and 88 to the terminal 55. The forward-biased diodes 87/88 clamps the potential difference between the terminals 54 and 55 at 1.6 volts, i.e., the total of the built-in potential of the diode 87 and the built-in potential of the diode 88, and the current flows from the terminal 54 through the forward-biased diode 87, the second common discharge line 60 and the froward-biased diode 88 to the terminal 55 as indicated by arrow Pd. Thus, the electrostatic discharge ESD takes place between the terminals 54 and 55, and the negative electrostatic pulse does not damage the internal circuit 51.

When either positive or negative electrostatic pulse is applied between any two of the terminals 53 to 58, the protection circuit 52 similarly prevents the internal circuit 51 from the electrostatic pulse, and any serious electrostatic destruction does not take place in the internal circuit 51.

Figure 9:
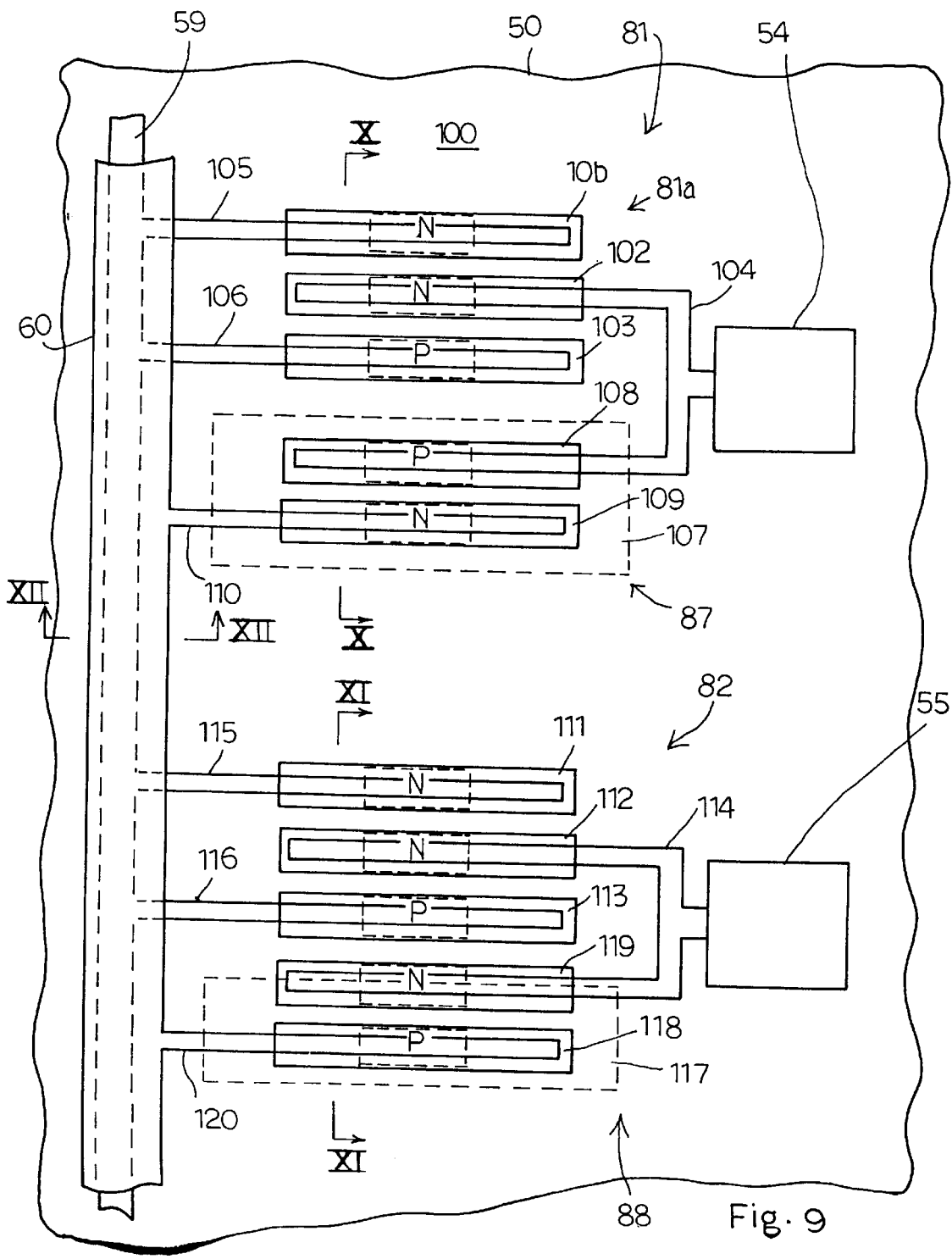
FIG. 9 is a plane view showing the layout of the protection circuit.
Figure 10:
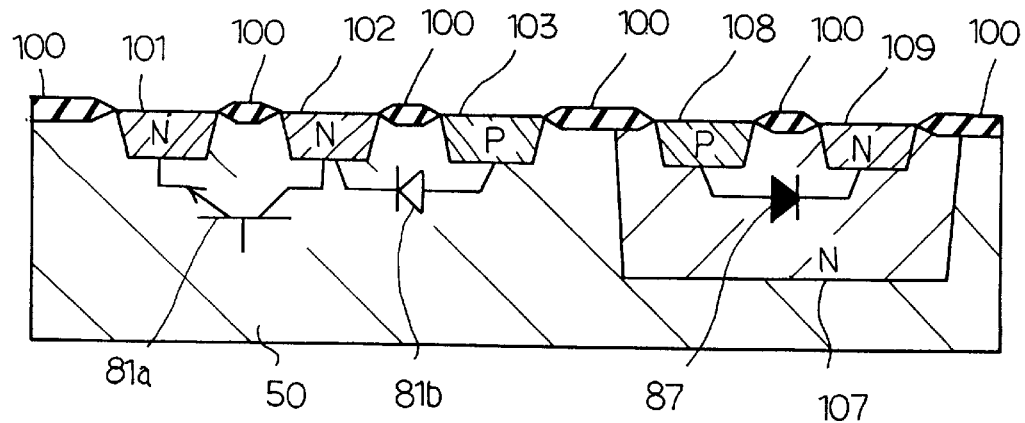
FIG. 10 is a cross sectional view taken along line X—X of FIG. 9 and showing the structure of a protection element and a diode associated with one of the terminals.

Subsequently, description is made on the layout of the protection circuit in the area 50b with reference to FIG. 9 of the drawings. The semiconductor integrated circuit device is fabricated on the p-type semiconductor substrate 50 through a CMOS process, and the protection circuit 52 is completed during the fabrication. A field oxide layer 100 is selectively grown on the major surface of the p-type semiconductor substrate 50, and isolates surface portions of the p-type semiconductor substrate 50. N-type impurity regions 101 and 102 and the p-type semiconductor substrate 50 constitute the lateral bipolar transistor 81a, and a p-type impurity region 103 and the n-type impurity region 102 form in combination the diode 81b as will be better seen in FIG. 10. The n-type impurity region 102 serves as the collector and the cathode, and is connected through a conductive strip 104 to the terminal 54. On the other hand, the n-type impurity region 101 serves as the emitter, and is connected through a conductive strip 105 to the first common discharge line 59. The p-type impurity region 103 serves as the anode, and is connected through a conductive strip 106 to the first common discharge line 59.

An n-type well 107 is formed in the p-type semiconductor substrate 50, and a p-type impurity region 108 and an n-type impurity region 109 are formed in the n-type well 107. The p-type impurity region 108 and the n-type impurity region 109 serve as the anode and the cathode ofthe diode 87, respectively. The conductive strip 104 is bifurcated, and the p-type impurity region 108 is connected to the conductive strip 104. On the other hand, the n-type impurity region 109 is connected through a conductive strip 110 to the second common discharge line 60.

Figure 1:
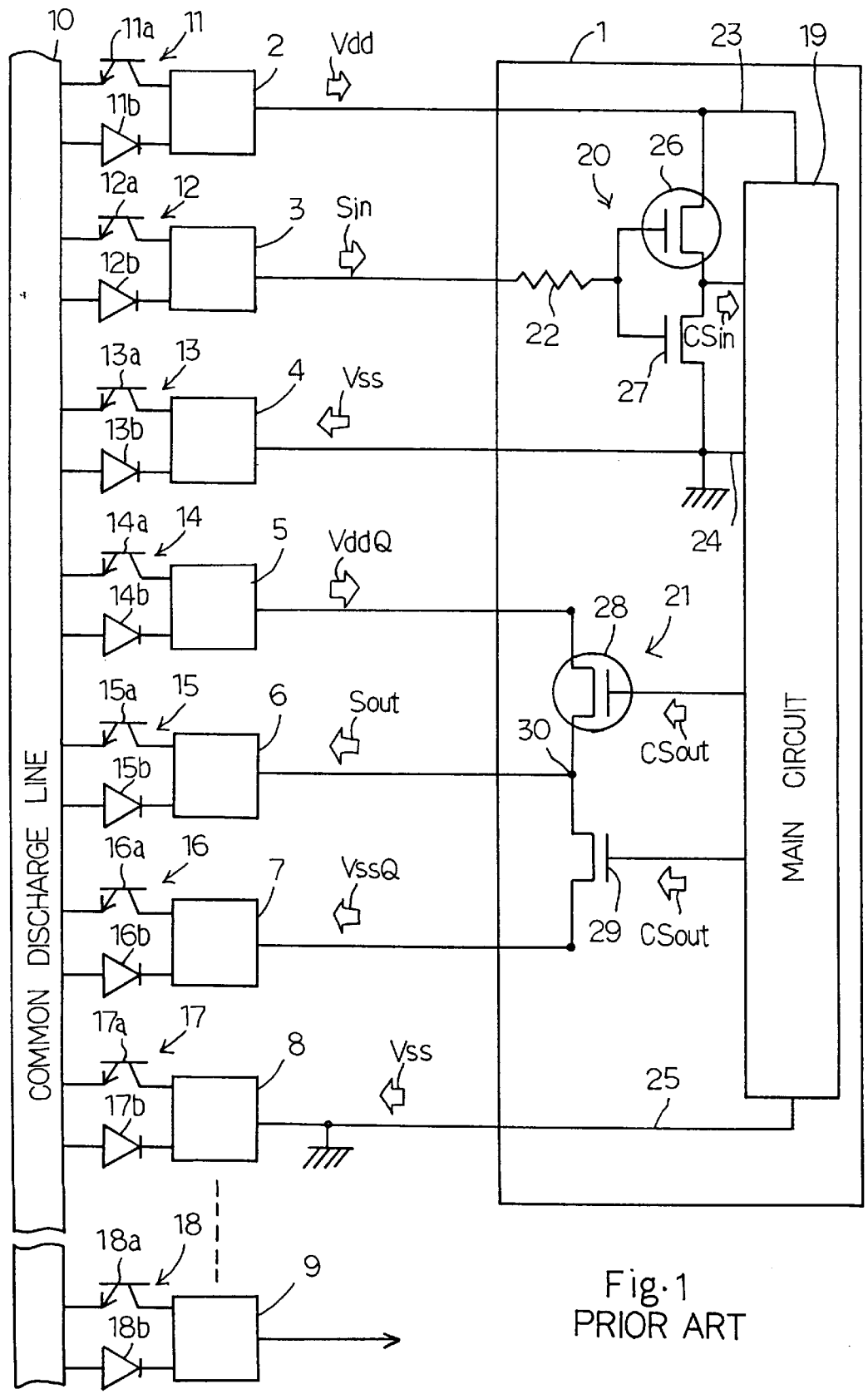
FIG. 1 is a circuit diagram showing the configuration of the prior art protection circuit disclosed in Japanese Patent Publication of Unexamined Application No. 7-86510.
Figure 2:
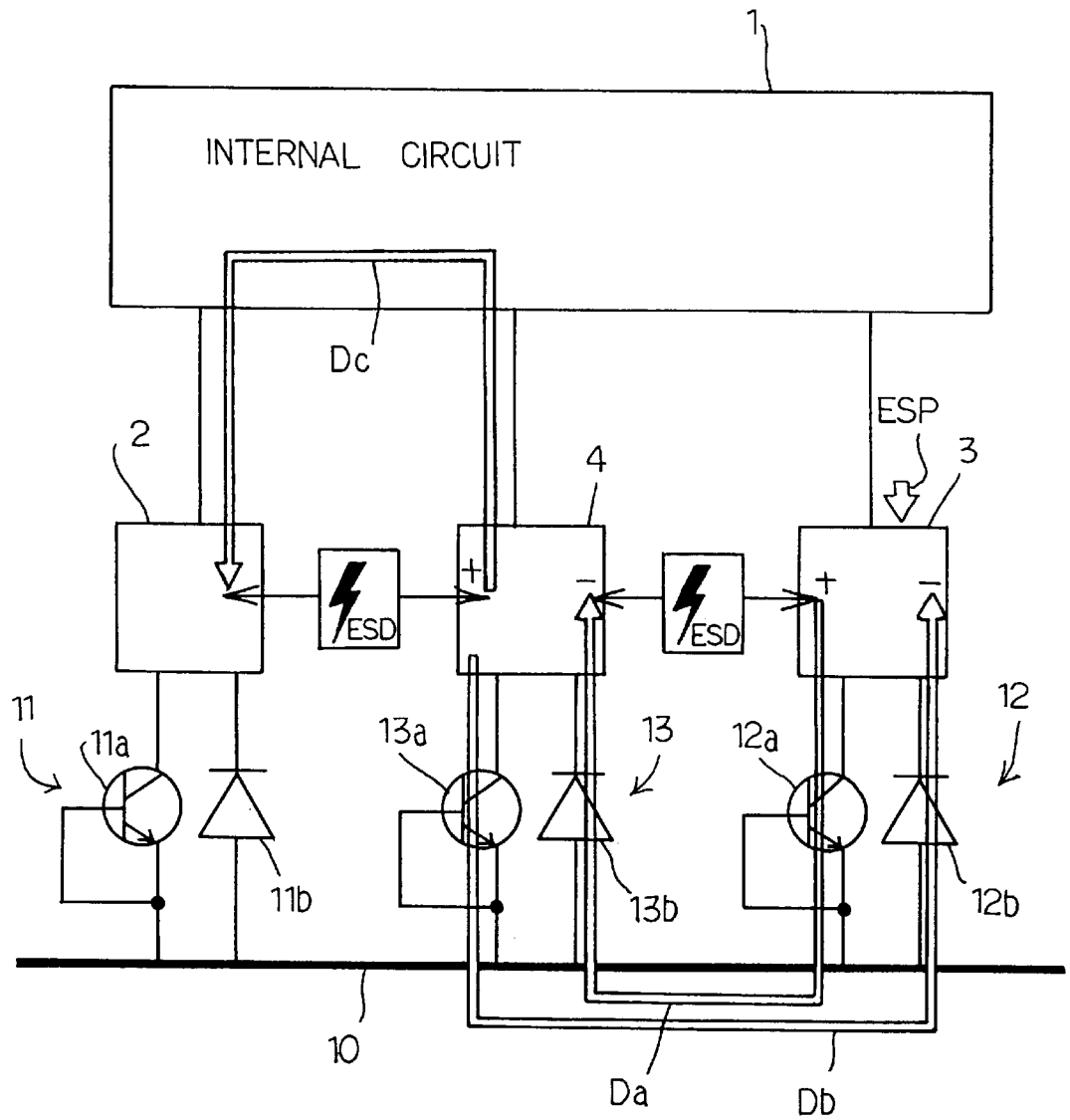
FIG. 2 is a circuit diagram showing the discharge paths between the Vss terminal and the signal input terminal.

The protection element 82 and the diode 88 are similarly fabricated on the p-type semiconductor substrate 50. N-type impurity regions 111 and 112 and the p-type semiconductor substrate 50 constitute the lateral bipolar transistor 82a, and a p-type impurity region 113 and the n-type impurity region 112 form in combination the diode 82b as shown in FIG. 1. The n-type impurity region 112 serves as the collector and the cathode, and is connected through a conductive strip 114 to the terminal 55. On the other hand, the n-type impurity region 111 serves as the emitter, and is connected through a conductive strip 115 to the first common discharge line 59. The p-type impurity region 113 serves as the anode, and is connected through a conductive strip 116 to the first common discharge line 59.

An n-type well 117 is formed in the p-type semiconductor substrate 50, and a p-type impurity region 18 and an n-type impurity region 119 are formed in the n-type well 117. The p-type impurity region 118 and the n-type impurity region 119 serve as the anode and the cathode of the diode 88, respectively. The conductive strip 114 is bifurcated, and the n-type impurity region 119 is connected to the bifurcated conductive strip 114. On the other hand, the p-type impurity region 119 is connected through a conductive strip 120 to the second common discharge line 60.

Figure 11:
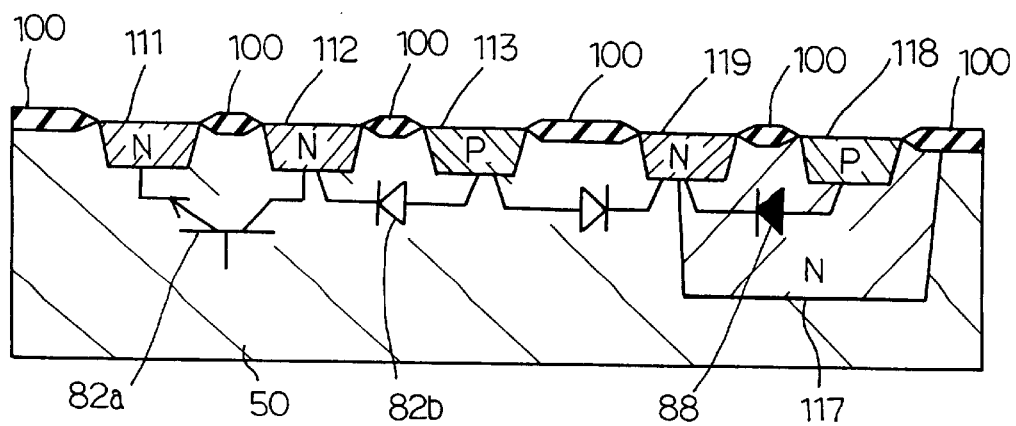
FIG. 11 is a cross sectional view taken along line XI—XI of FIG. 9 and showing the structure of a protection element and a diode associated with another terminal.

Thus, the voltage clamping elements 81a/82a are implemented by the lateral bipolar transistors, and the clamping voltage Vsbp is regulated by changing the space between the n-type impurity regions 101/111 and 102/112. If the n-type impurity regions 101/111 are closed to the other n-type impurity regions 102/112, the clamping voltage Vsbp is decreased. The other protection elements 83 to 86 and the diodes 89/90 are similar in structure to those shown in FIGS. 9 to 11.

Figure 12:
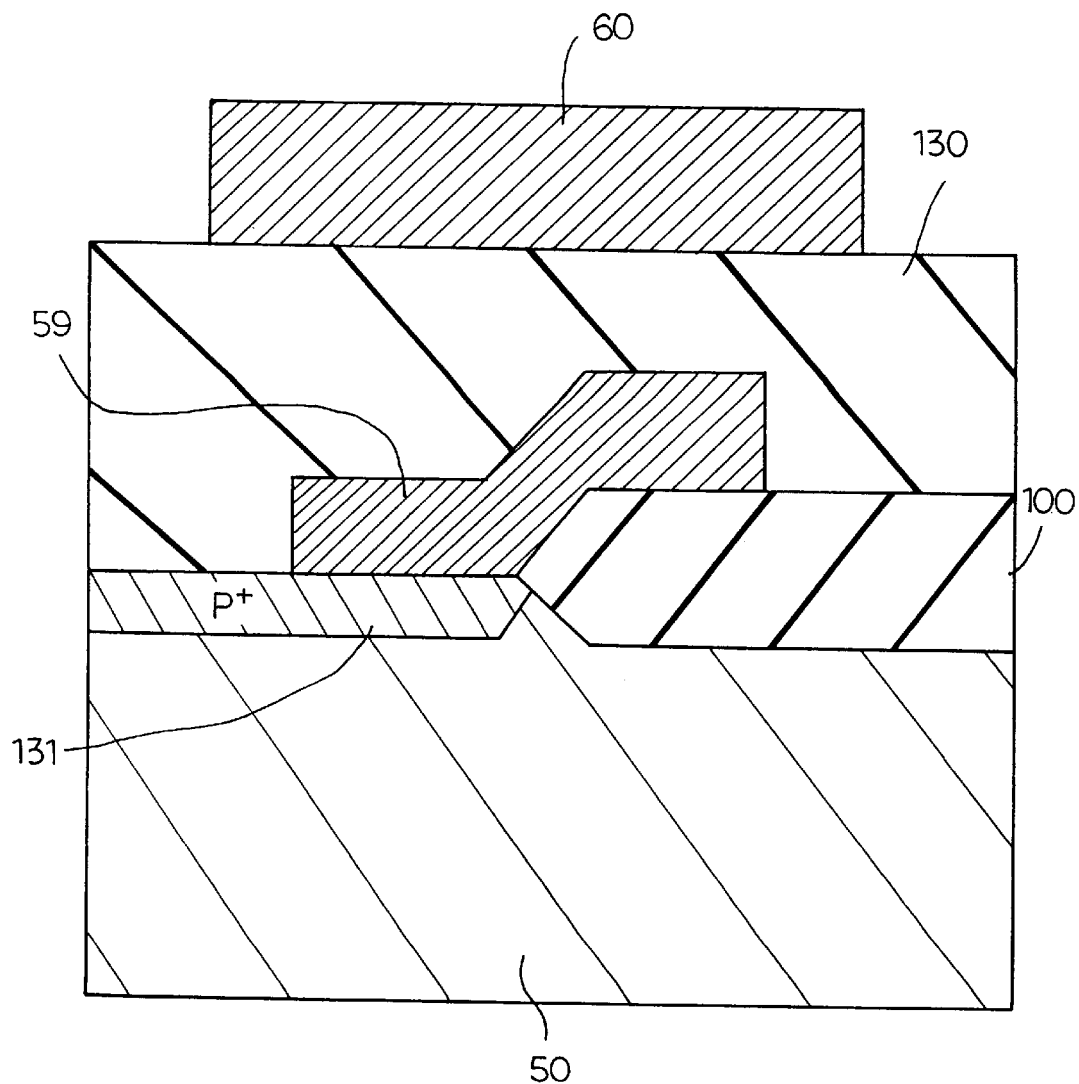
FIG. 12 is a cross sectional view taken along line XII—XII of FIG. 9 and showing the structure of common discharge lines.

The first common discharge line 59 and the second common discharge line 60 are implemented by aluminum strips, and are vertically spaced from each other by an inter-level insulating layer 130 as shown in FIG. 12. The first common discharge line 59 is held in contact with a heavily doped p-type impurity region 131, and transfers the predetermined potential level from the substrate biasing circuit 63 through the heavily doped p-type impurity region 131 to the p-type semiconductor substrate 50. In this instance, a scribe line around the periphery of the semiconductor substrate 50 serves as the first common discharge line 59.

As will be understood from the foregoing description, the protection elements 81 to 86 and the diodes 87 to 90 are located in the vicinity of the terminals 53 to 58 and the common discharge lines 59/60, and the conductive strips 104/110 to the diode 87 are approximately equal in length to the conductive strips to the other diodes such as 88. For this reason, the resistance against the electrostatic current is constant regardless of the diodes 87 to 90, and the protection circuit 52 achieves the stable protection characteristics.

Moreover, the diodes 87 to 90 are arranged in the vicinity of the associated protection elements 81 to 86, and the layout design is not complicated.

The diodes 87 to 90 have the p-n junction structure, and are fabricated on the semiconductor substrate 50 without any additional step.

The diodes 87 to 90 are provided for the terminals assigned to the power voltages Vdd/Vss, respectively, and are less than the diode-connected field effect transistors 35 to 40. For this reason, the protection circuit 52 according to the present invention is occupied on relatively narrow area, and is available for an ultra large scale integration with many power voltage terminals.

Second Embodiment

Figure 13:
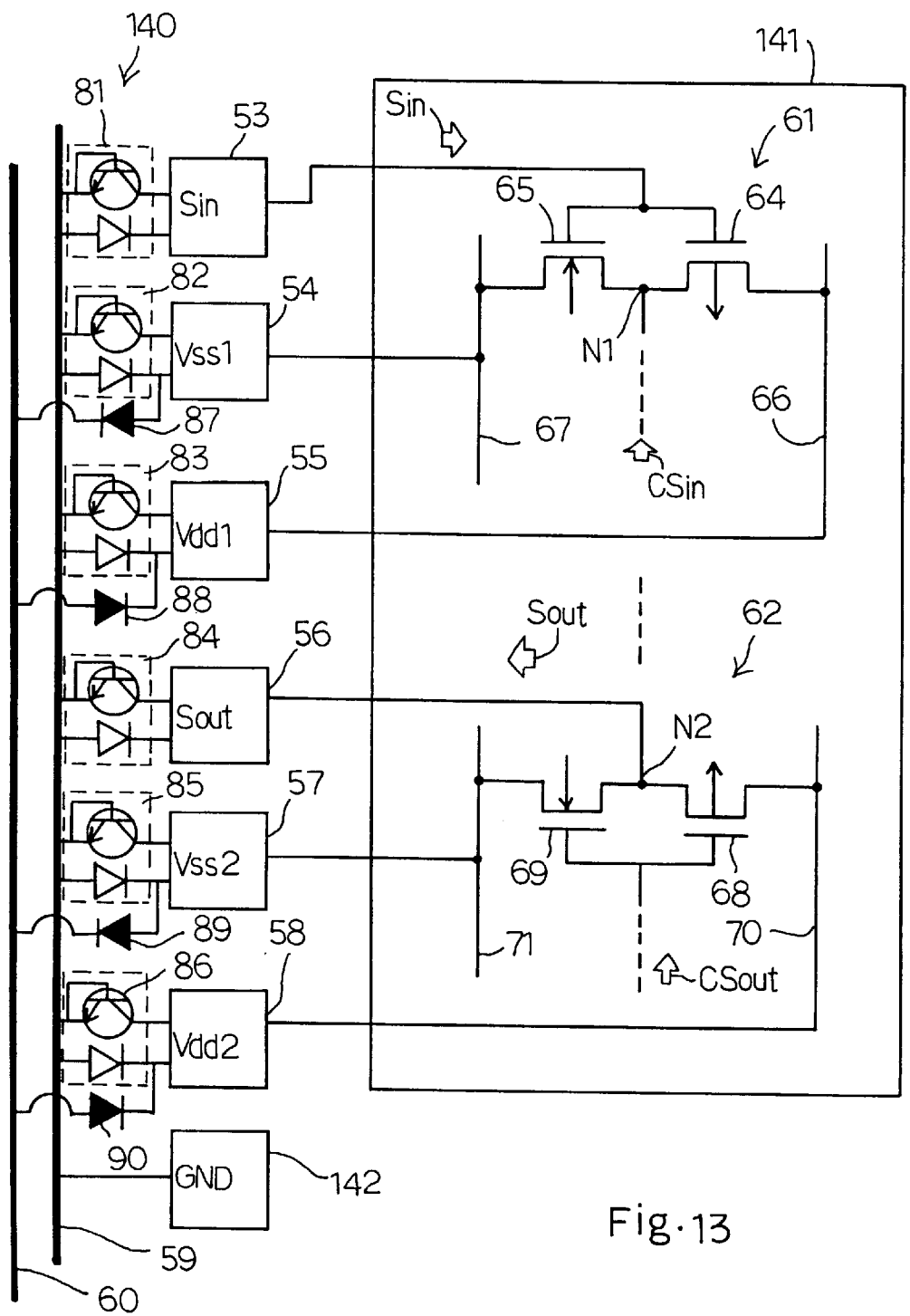
FIG. 13 is a circuit diagram showing the configuration of another protection circuit according to the present invention.

FIG. 13 illustrates another protection circuit 140 embodying the present invention. The protection circuit 140 is similar to the protection circuit 52 except for a source of constant potential source connected to the first common discharge line 59. For this reason, circuit components, lines and terminals are labeled with the same references designating corresponding circuit components, lines and terminals shown in FIG. 6 without detailed description.

Although the first embodiment, the first common discharge line 59 is connected to the substrate biasing, circuit 63, a terminal 142 assigned to the ground level is connected to the first common discharge line 59. The semiconductor substrate is biased to the ground level through the first common discharge line 59. The protection circuit 140 achieves all the advantages of the first embodiment.

Although particular embodiments of the present invention have been shown and described, it will be obvious to those skilled in the art that various changes and modifications may be made without departing from the spirit and scope of the present invention.

For example, a p-n-p bipolar transistor or a thyrister may implement the voltage clamping element. The first common discharge line 59 may be formed over the second common discharge line 60. In this instance, the second common discharge line 60 may be implemented by the scribe line.

What is claimed is:

1. A protection circuit for preventing an internal circuit connected to first terminals assigned to electric signals and second terminals selectively assigned to a first power voltage and a second power voltage from excess voltage, comprising:

a plurality of first protection elements, each of said first protection elements being connected between a first common discharge line and one of said first and second terminals and providing a bidirectional current path between two of said first and second terminals for current due to said excess voltage; and a plurality of second protection elements connected between a second common discharge line and said second terminals and providing a unidirectional current path between two of said second terminals for said current.

2. The protection circuit as set forth in claim 1, in which each of said plurality of first protection elements has a voltage clamping element connected between associated one of said first and second terminals and said first common discharge line for flowing said current from said associated one of said first and second terminals to said first common discharge line and a diode connected in parallel to said voltage clamping element for flowing said current from said first common discharge line to said associated one of said first and second terminals.

3. The protection circuit as set forth in claim 1, in which each of said plurality of second protection elements is implemented by a diode connected between said second common discharge line and associated one of said second terminals.

4. The protection circuit as set forth in claim 3, in which said first power voltage is lower than said second power voltage, and the diode serving as one of said plurality of second protection elements has an anode connected to said associated one of said second terminals supplied with said first power voltage and a cathode connected to said second common discharge line, and the diode serving as another of said plurality of second protection elements has an anode connected to said second common discharge line and a cathode connected to another of said second terminals supplied with said second power voltage.

5. The protection circuit as set forth in claim 4, in which said first power voltage and said second power voltage are ground voltage and positive power voltage, respectively.

6. The protection circuit as set forth in claim 1, in which each of said plurality of first protection elements has a voltage clamping element connected between associated one of said first and second terminals and said first common discharge line for flowing said current from said associated one of said first and second terminals to said first common discharge line and a first diode connected in parallel to said voltage clamping element for flowing said current from said first common discharge line to said associated one of said first and second terminals, and each of said plurality of second protection elements is implemented by a second diode connected between said second common discharge line and associated one of said second terminals.

7. The protection circuit as set forth in claim 6, in which said first power voltage is lower than said second power voltage, and the second diode serving as one of said plurality of second protection elements has an anode connected to said associated one of said second terminals supplied with said first power voltage and a cathode connected to said second common discharge line, and the second diode serving as another of said plurality of second protection elements has an anode connected to said second common discharge line and a cathode connected to another of said second terminals supplied with said second power voltage.

8. The protection circuit as set forth in claim 7, in which said first power voltage and said second power voltage are ground voltage and positive power voltage, respectively.

9. The protection circuit as set forth in claim 6, in which said voltage clamping element is implemented by a bipolar transistor.

10. The protection circuit as set forth in claim 6, in which said voltage clamping element is implemented by a lateral bipolar transistor.

11. The protection circuit as set forth in claim 1, in which said protection circuit, said internal circuit, said first terminals, said second terminals, said first common discharge line and said second common discharge line are fabricated on a semiconductor substrate, and one of said first common discharge line and said second common discharge line is electrically connected to said semiconductor substrate.

12. The protection circuit as set forth in claim 11, in which said first common discharge line and said second common discharge line are spaced from each other in a direction perpendicular to a major surface of said semiconductor substrate.

13. The protection circuit as set forth in claim 1, in which said first common discharge line and said second common discharge line extend on a semiconductor substrate in a first direction, said first terminals and said second terminals are arranged on said semiconductor substrate in a second direction substantially parallel to said first direction, and said plurality of first protection elements and said plurality of second protection elements are fabricated on a surface portion of said semiconductor substrate between said first and second common discharge lines and said first and second terminals.

* * * * *